(12) United States Patent
Jangjian et al.

(10) Patent No.: US 10,818,716 B2
(45) Date of Patent: *Oct. 27, 2020

(54) IMAGE SENSOR DEVICE AND FABRICATING METHOD THEREOF

(71) Applicant: TAIWAN SEMICONDUCTOR MANUFACTURING CO., LTD., Hsinchu (TW)

(72) Inventors: Shiu-Ko Jangjian, Tainan (TW); Chih-Nan Wu, Tainan (TW); Chun-Che Lin, Tainan (TW); Yu-Ku Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/525,372

(22) Filed: Jul. 29, 2019

(65) Prior Publication Data
US 2019/0348458 A1 Nov. 14, 2019

Related U.S. Application Data

(63) Continuation of application No. 14/109,318, filed on Dec. 17, 2013, now Pat. No. 10,367,021.

(51) Int. Cl.
*H01L 27/146* (2006.01)

(52) U.S. Cl.
CPC .... *H01L 27/14627* (2013.01); *H01L 27/1463* (2013.01); *H01L 27/14621* (2013.01); *H01L 27/14645* (2013.01); *H01L 27/14685* (2013.01)

(58) Field of Classification Search
CPC .......... H01L 31/0232; H01L 31/02322; H01L 31/02327; H01L 31/0216–02366; H01L 27/14627; H01L 27/1463; H01L 27/14654; H01L 27/1464
See application file for complete search history.

(56) References Cited

U.S. PATENT DOCUMENTS

| 6,043,481 A * | 3/2000 | Tan | H01L 27/14627 |
| | | | 250/214.1 |
| 6,618,201 B2 * | 9/2003 | Nishikawa | G02B 3/0018 |
| | | | 359/619 |
| 7,023,034 B2 * | 4/2006 | Kuriyama | H01L 27/1463 |
| | | | 257/291 |
| 7,264,976 B2 * | 9/2007 | Deng | B29D 11/00278 |
| | | | 257/E33.068 |
| 10,367,021 B2 * | 7/2019 | Jangjian | H01L 27/14645 |

(Continued)

*Primary Examiner* — Tuan A Hoang
(74) *Attorney, Agent, or Firm* — Maschoff Brennan (57) ABSTRACT

An image sensor device includes a substrate, a pixel circuit, a dielectric structure, a photo sensitive element, a grid, and a convex dielectric lens. The substrate has a first side and a second side opposite to the first side. The pixel circuit is disposed on the first side of the substrate. The dielectric structure is disposed on the second side of the substrate. The photo sensitive element is disposed between the pixel circuit and the dielectric structure. The grid is disposed on the dielectric structure. The convex dielectric lens is disposed on the dielectric structure. The convex dielectric lens has a convex side. A topmost of the convex side is above an interface between the dielectric structure and the grid.

20 Claims, 9 Drawing Sheets

(56) References Cited

U.S. PATENT DOCUMENTS

| | | | |
|---|---|---|---|
| 2005/0274968 A1* | 12/2005 | Kuo | H01L 27/14685 257/98 |
| 2005/0287479 A1 | 12/2005 | Moon | |
| 2010/0269886 A1* | 10/2010 | Argentar | G02B 19/0042 136/246 |
| 2012/0261781 A1 | 10/2012 | Hsu et al. | |
| 2012/0267743 A1* | 10/2012 | Nakamura | H01L 27/14621 257/432 |
| 2013/0001724 A1 | 1/2013 | Masuda | |
| 2013/0134536 A1* | 5/2013 | Mori | H01L 27/1462 257/432 |
| 2013/0285181 A1 | 10/2013 | Lin et al. | |
| 2015/0109501 A1 | 4/2015 | Sekine | |

* cited by examiner

IMAGE SENSOR DEVICE AND FABRICATING METHOD THEREOF

PRIORITY CLAIM AND CROSS-REFERENCE

The present application is a continuation of U.S. patent application Ser. No. 14/109,318, filed Dec. 17, 2013, now U.S. Pat. No. 10,367,021, issued Jul. 30, 2019, which is incorporated herein by reference in its entirety.

BACKGROUND

Image sensor devices are widely used in various imaging applications and products, such as smart phones, digital cameras, scanners, etc. Typically, an image sensor device uses micro-lenses to condense incident light into color filters when the incident light first enters the image sensor device. However, various dielectric films used in the image sensor device with CMOS technology increase the number of optical paths, and such films are transparent to visible light. Even if the image sensor device includes a grid to block the optical paths from crossing subpixels, the incident light may dissipate (e.g. penetrate into other pixels under the grid), in which a crosstalk issue arises, resulting in signal-to-noise ratio (SNR) degradation.

BRIEF DESCRIPTION OF THE DRAWINGS

The invention can be more fully understood by reading the following detailed description of the embodiment, with reference made to the accompanying drawings as follows.

DETAILED DESCRIPTION

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "on" or "above" the other devices or characteristics. Therefore, the space orientation term "on" may include two orientations of "above" and "below".

Embodiments of the present disclosure are directed to providing an image sensor device for better photo sensing quality. In each pixel region of the image sensor device, a convex dielectric lens is formed between a color filter and a substrate for condensing incident light into a photo sensitive element, such that quantum efficiency is improved and a crosstalk issue is avoided for high signal-to-noise (SNR) ratio, thereby improving the photo sensing quality.

Figure 1:
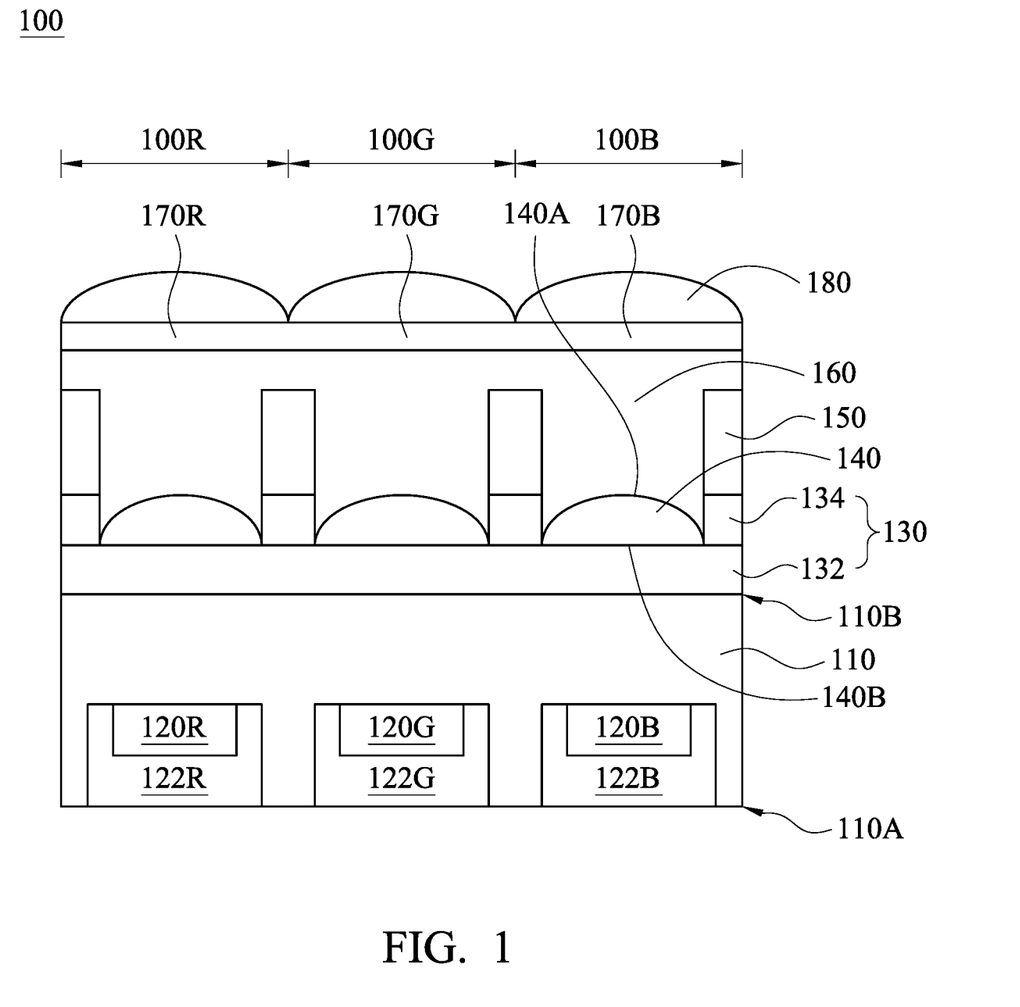
FIG. 1 illustrates a schematic cross-sectional diagram of an image sensor device in accordance with some embodiments of the present disclosure.

Referring to FIG. 1, FIG. 1 illustrates a schematic cross-sectional diagram of an image sensor device 100 in accordance with some embodiments of the present disclosure. In the present disclosure, the image sensor device 100 is a backside illuminated (BSI) image sensor device. The image sensor device 100 includes pixel regions 100R, 100G and 100B for converting incident light into RGB image data. It is noted that the sequence of the pixel regions 100R, 100G and 100B shown in FIG. 1 is shown as an example for explanation, and embodiments of the preset disclosure are not limited thereto.

In FIG. 1, the image sensor device 100 includes a substrate 110, photo sensitive elements 120R/120G/120B, pixel circuits 122R/122G/122B, a first dielectric structure 130, convex dielectric lenses 140, a grid 150, a second dielectric structure 160, color filters 170R/170G/170B and micro-lenses 180. The substrate 110 is a semiconductor substrate, which includes, but not limited to, a semiconductor wafer, a silicon-on-insulator (SOI) substrate, an epitaxial substrate. In some embodiments, the substrate 110 further includes an elementary semiconductor such as silicon, germanium and diamond. In another embodiments, the substrate 100 further includes a compound semiconductor, such as silicon carbide, gallium arsenic, gallium carbide, gallium phosphide, indium arsenide and indium phosphide, or an alloy semiconductor, such as silicon germanium, silicon germanium carbide, gallium arsenic phosphide and gallium indium phosphide.

The substrate 110 has a front side 110A and a back side 110B. The photo sensitive elements 120R/120G/120B are formed on the front side 110A of the substrate 110. The photo sensitive elements 120R/120G/120B are configured to receive the incident light transmitted from the back side 110B through the substrate 110, and then to convert the incident light to RGB image data. In some embodiments, the photo sensitive element 120R/120G/120B are photodiodes, pinned photodiodes, partially pinned photodiodes, photogates or photo transistors.

The pixel circuits 122R/122G/122B are formed on the front side 110A of the substrate 110 and adjacent the photo sensitive elements 120R/120G/120B respectively for electrical interconnecting with the photo sensitive elements 120R/120G/120B, so as to transfer electric charges generated from the photo sensitive elements 120R/120G/120B. For illustration, each of the pixel circuits 122R/122G/122B includes a reset transistor, a source follower transfer, a row select transistor and a transfer transistor.

The first dielectric structure 130 is formed on the back side 110B of the substrate 110. In FIG. 1, the first dielectric structure 130 includes a first dielectric layer 132 and a second dielectric layer 134. The first dielectric layer 132 is formed on the back side 110B of the substrate 110, and the second dielectric layer 134 is formed on the first dielectric layer 132. The first dielectric layer 132 and the second dielectric layer 134 may include a transparent material, such as silicon oxide, silicon nitride, combinations thereof, or the like. In some embodiments, that the material forming the first dielectric layer 132 is selected to have a refractive index greater than that of the second dielectric layer 134.

In each of the pixel regions 100R/100G/100B, the convex dielectric lens 140 is formed in the first dielectric structure 130. As shown in FIG. 1, the second dielectric layer 134 includes recesses for forming the convex dielectric lenses 140 therein. At least one portion of each of the convex dielectric lenses 140 is located in the second dielectric layer 134. In other words, a height of each of the convex dielectric lenses 140 may be greater than, equal to or smaller than a depth of each of the recesses. Each of the convex dielectric lenses 140 has a refractive index lower than that of the second dielectric layer 134. Each of the convex dielectric lenses 140 has a convex side 140A and a planar side 140B. The convex side 140A is oriented toward the incident light, whereas the planar side 140B is directly on the recess 136 and oriented toward the photo sensitive element 120R/120G/120B.

In some embodiments, the first dielectric structure 130 is a single layer structure. The first dielectric structure 130 may include a transparent material, such as silicon oxide, silicon nitride, combinations thereof, or the like. The first dielectric structure 130 has a refractive index greater than that of each of the convex dielectric lenses 140.

The grid 150 is formed on the first dielectric structure 130. The grid 150 separates the pixel regions 100R/100G/100B for preventing the incident light from passing therethrough. In some embodiments, the grid 150 includes an insulating material such as silicon oxide, silicon nitride, silicon oxynitride, combinations thereof, or the like. In some embodiments, the grid 150 includes a metal material such as aluminum, copper, or the like, a metal alloy material such as aluminum alloy, copper alloy, or the like, a metal nitride such as titanium nitride, tantalum nitride, or other suitable material.

The second dielectric structure 160 is formed on the first dielectric structure 130, the convex dielectric lenses 140 and the grid 150. The second dielectric layer 160 may include a transparent material, such as silicon oxide, silicon nitride, combinations thereof, or the like. The material of the second dielectric structure 160 is selected to have a refractive index smaller than that of each of the convex dielectric lenses 140. In some embodiments, the second dielectric structure 160 at least partially covers the convex dielectric lenses 140.

The color filters 170R/170G/170B are formed on the second dielectric structure 160 and respectively in the pixel regions 100R/100G/100B. The color filters 170R/170G/170B filter the incident light to thereby obtain red, green and blue lights, respectively. For illustration, the color filters 170R/170G/170B include a dyed or pigmented material such as polymer, or other suitable material.

The micro-lenses 180 are formed on the color filters 170R/170G/170B and in the pixel regions 100R/100G/100B respectively. The micro-lenses 180 focus the incident light onto the photo sensitive elements 120R/120G/120B. For illustration, the micro-lenses 180 are formed of any material that may be patterned and formed into lenses with high transmittance, such as acrylic polymer and other suitable material.

Figure 2A:
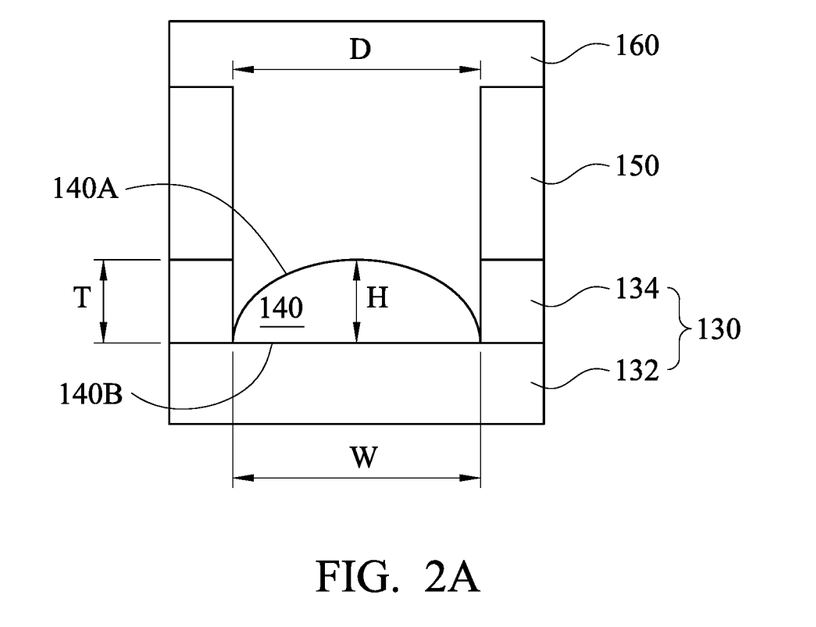
FIGS. 2A-2B illustrate schematic enlarged partial views of the image sensor device in FIG. 1 in accordance with various embodiments.
Figure 2B:
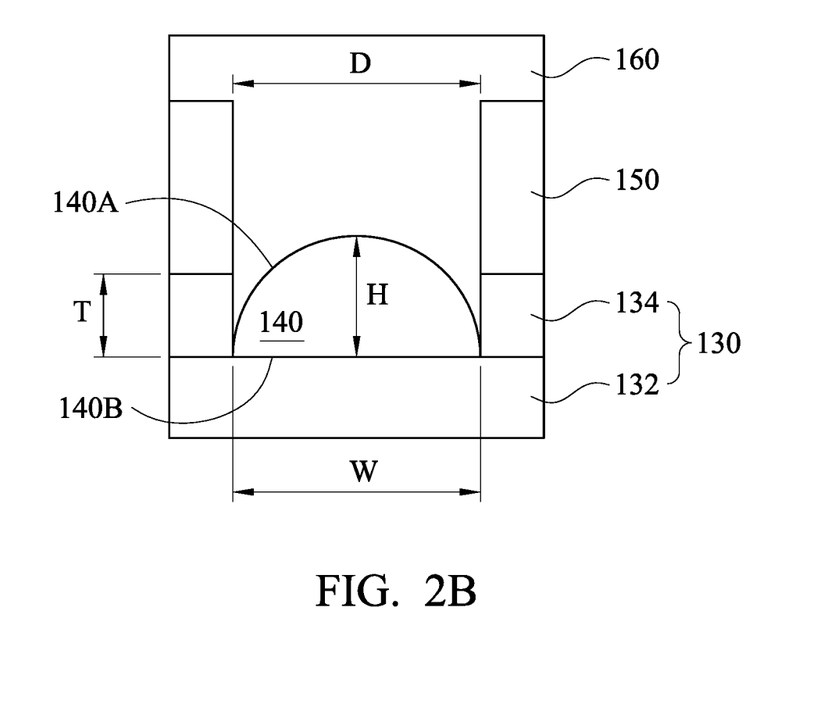

Referring to FIGS. 2A-2B, FIGS. 2A-2B illustrate enlarged partial views of the image sensor device 100 shown in FIG. 1 in accordance with various embodiments. Each of the convex dielectric lenses 140 has a width W and a height H. As shown in FIG. 2A, the width W of the convex dielectric lens 140 is substantially identical to a distance D between two opposite sides of the grid 150, and the height H of the convex dielectric lens 140 is substantially identical to a thickness T of the second dielectric layer 134. Alternatively, the height H of the convex dielectric lens 140 may be smaller than the thickness T of the second dielectric layer 134. In such cases, the convex dielectric lens 140 is entirely in the second dielectric layer 134. In some embodiments, as shown in FIG. 2B, the height H of the convex dielectric lens 140 is greater than the thickness T, such that a portion 142 of the convex dielectric lens 140 is in the second dielectric layer 134. The height H of the convex dielectric lens 140 may vary in accordance with the refractive indexes of the convex dielectric lens 140, the first dielectric layer 132 and the second dielectric structure 160. Further, in certain embodiments, the width W of the convex dielectric lens 140 may be greater than the distance D.

Figure 3A:
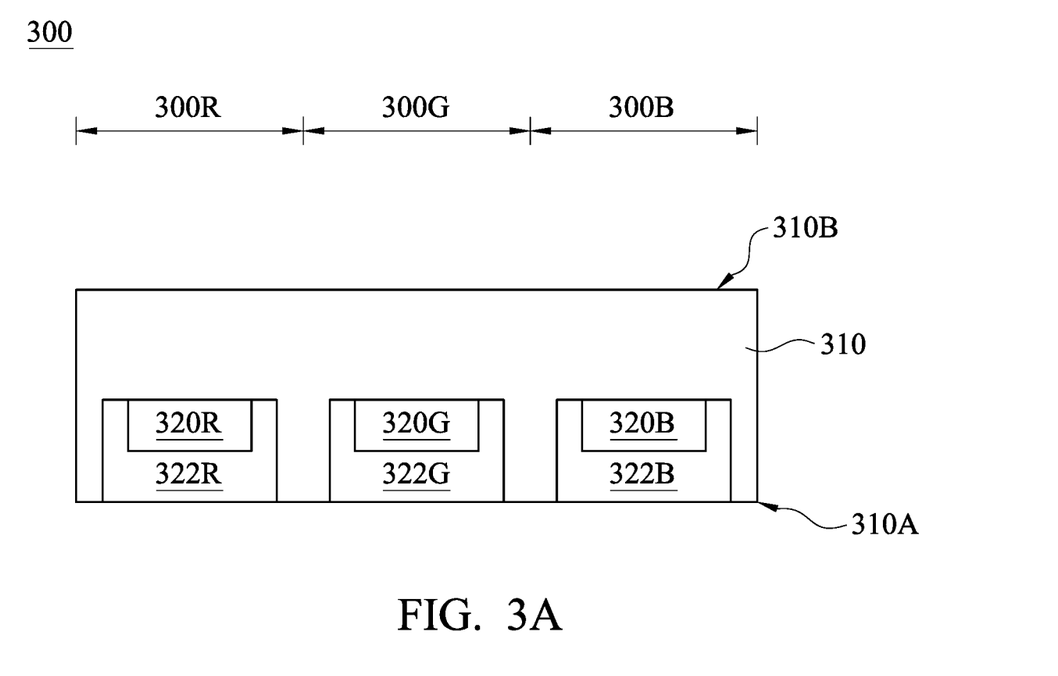
FIGS. 3A-3H illustrate schematic cross-sectional diagrams of intermediate stages in accordance with a method for fabricating an image sensor device in some embodiments of the present disclosure.

Referring to FIGS. 3A-3H, FIGS. 3A-3H illustrate cross-sectional diagrams for fabricating an image sensor device 300 in accordance with some embodiments of the present disclosure. In FIG. 3A, a substrate 310, photo sensitive elements 320R/320G/320B and pixel circuits 322R/322G/322B are provided. The substrate 310 is a semiconductor substrate, which includes, but not limited to, a semiconductor wafer, a silicon-on-insulator (SOI) substrate or an epitaxial substrate. In some embodiments, the substrate 310 further includes an elementary semiconductor, a compound semiconductor or an alloy semiconductor. The photo sensitive elements 320R/320G/320B are formed on the front side 310A of the substrate 310 and in the pixel regions 300R/300G/300B respectively. In some embodiments, the photo sensitive elements 320R/320G/320B are formed by a diffusion process or an ion implantation process. For illustration, if the photo sensitive elements 320R/320G/320B are PNP-type photodiodes formed by the ion implantation process, the photo sensitive elements 320R/320G/320B includes P-type pinned layers formed on N-type doped regions, and the substrate 310 is a P-type semiconductor substrate, in which the N-type doped regions are formed on the substrate 310. In addition, the pixel circuits 322R/322G/322B are formed on the front side 310A of the substrate 310 and adjacent the photo sensitive elements 320R/320G/320B respectively.

Figure 3B:
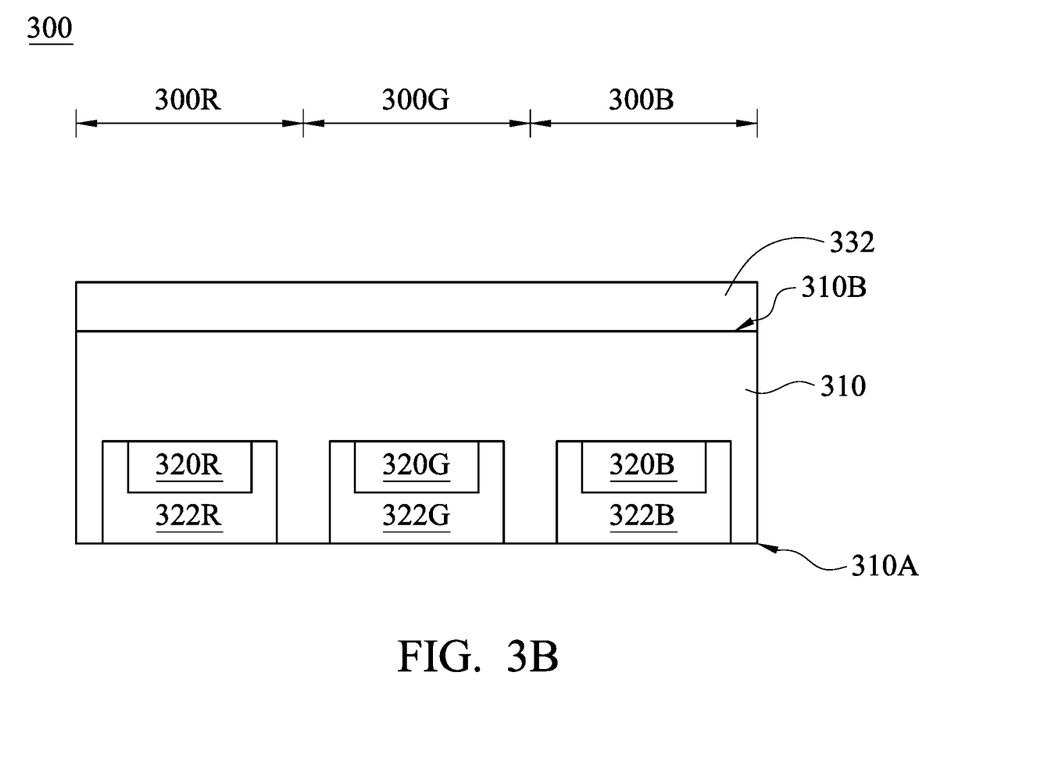

In FIG. 3B, a first dielectric layer 332 is formed on the back side 310B of the substrate 310 opposite to the front site 310A. For illustration, the first dielectric layer 332 is formed by a deposition process such as chemical vapor deposition (CVD), physical vapor deposition (PVD), atomic layer deposition (ALD), combinations thereof, or the like.

Figure 3C:
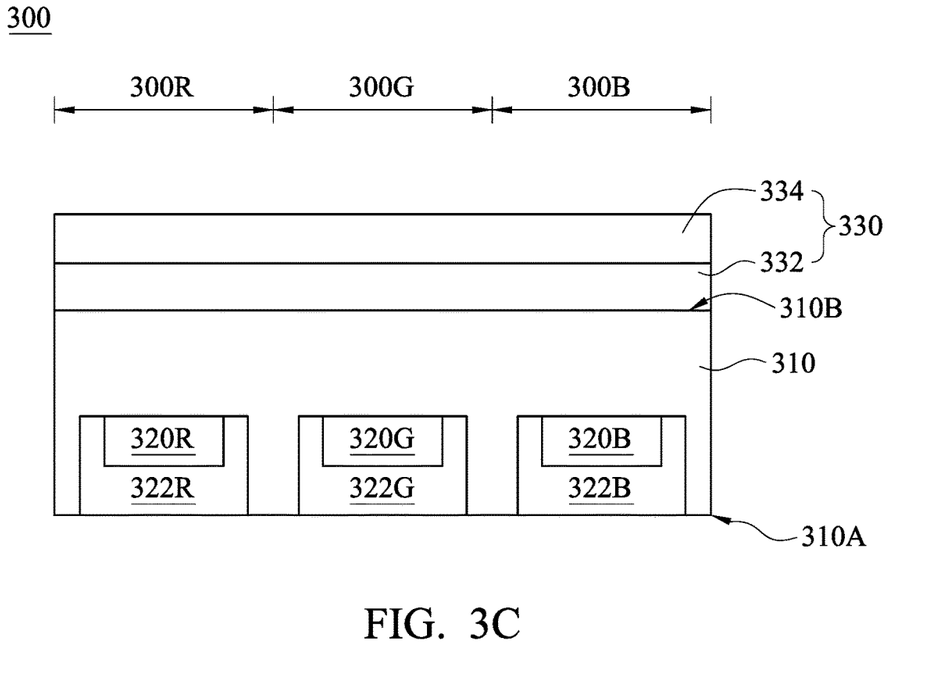

In FIG. 3C, a second dielectric layer 334 is formed on the first dielectric layer 332. For illustration, the second dielectric layer 334 is formed by a deposition process such as CVD, PVD, ALD, combinations thereof, or the like. The first dielectric layer 332 and the second dielectric layer 334 forms a first dielectric structure 330. In some embodiments, the material of the first dielectric layer 332 and the second dielectric layer 334 are selected, such that the first dielectric layer 332 has a refractive index greater than the second dielectric layer 334.

Figure 3D:
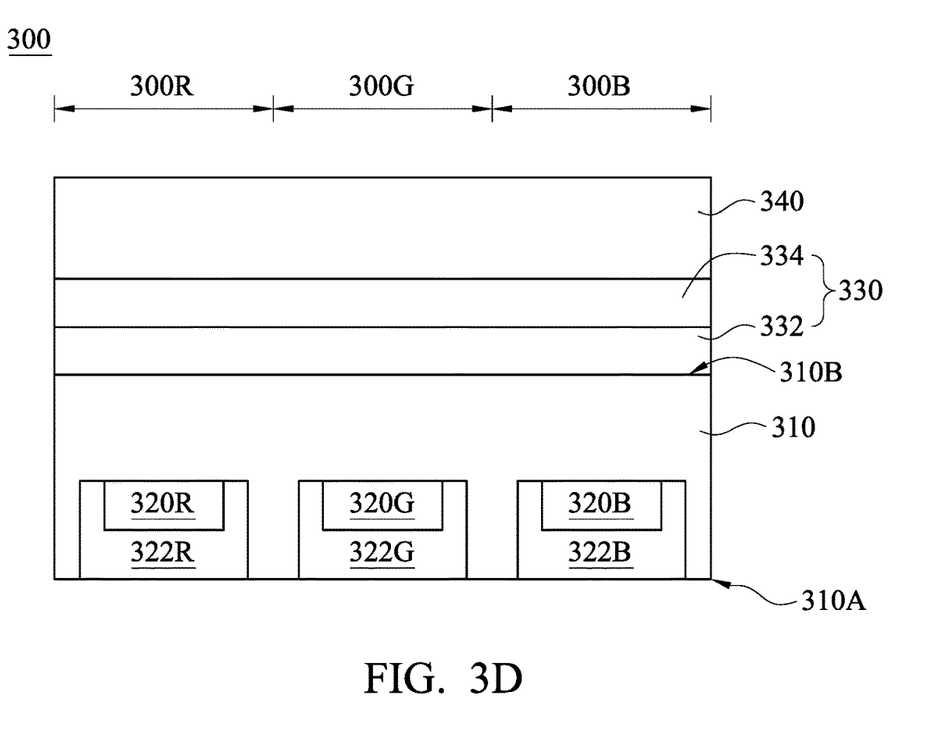

In FIG. 3D, an isolating layer 340 is formed on the second dielectric layer 334. In some embodiments, the isolating layer 340 includes an insulating material such as silicon oxide, silicon nitride, silicon oxynitride, combinations thereof, or the like. In some embodiments, the isolating layer 340 includes a metal material such as aluminum, copper, or the like, a metal alloy material such as aluminum alloy, copper alloy, or the like, a metal nitride such as titanium nitride, tantalum nitride, or other suitable material. For illustration, the isolating layer 340 is formed by a deposition process such as CVD, PVD, or any suitable process.

Figure 3E:
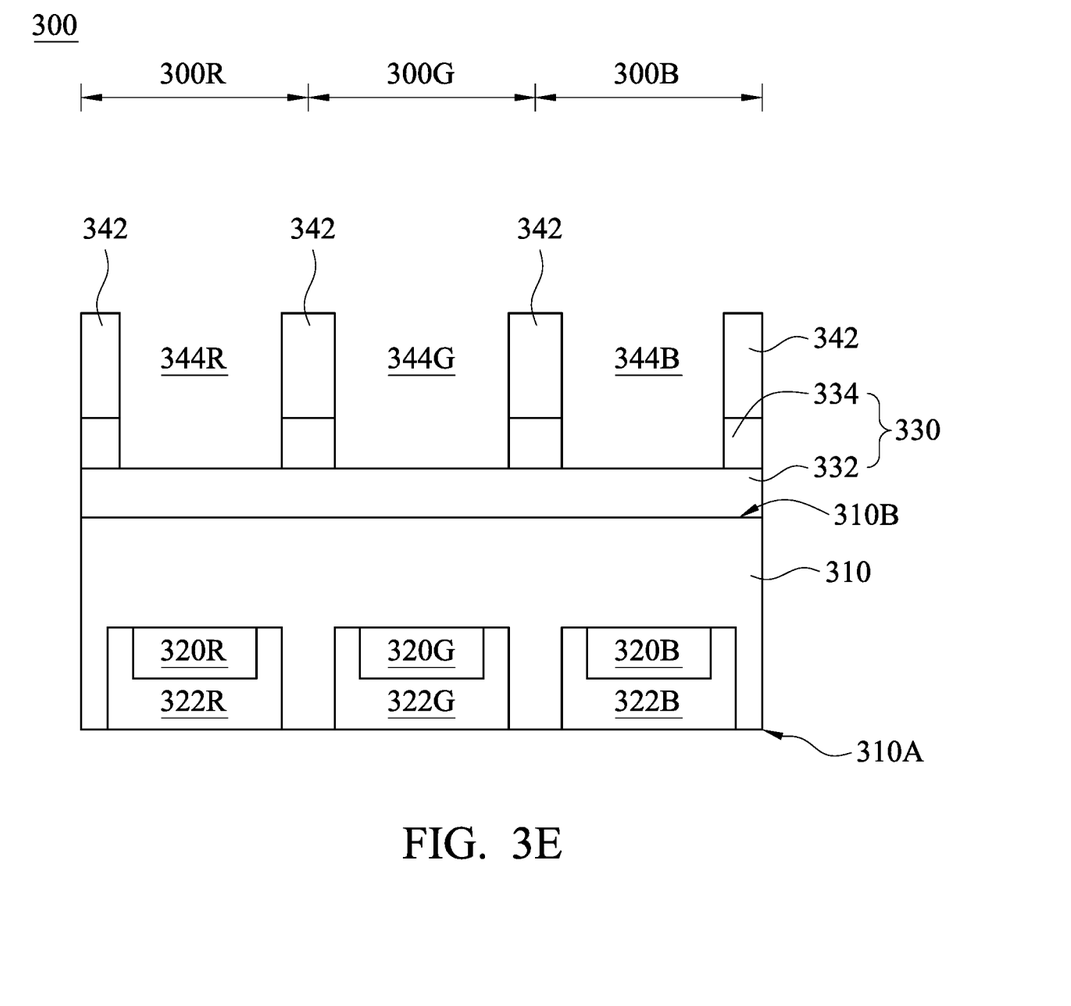

In FIG. 3E, a grid 342 and recesses 344R/344G/344B are formed by an etching process. The recesses 344R/344G/344B are formed by removing parts of the isolating layer 340 and the second dielectric layer 334. For illustration, the etching process includes dry etching, wet etching, drilling, combinations thereof, or the like. Bottoms of the recesses 344R/344G/344G directly adjoin the first dielectric layer 332. The grid 342 is also formed for separating the pixel regions 300R/300G/300B after the etching process is done.

Figure 3F:
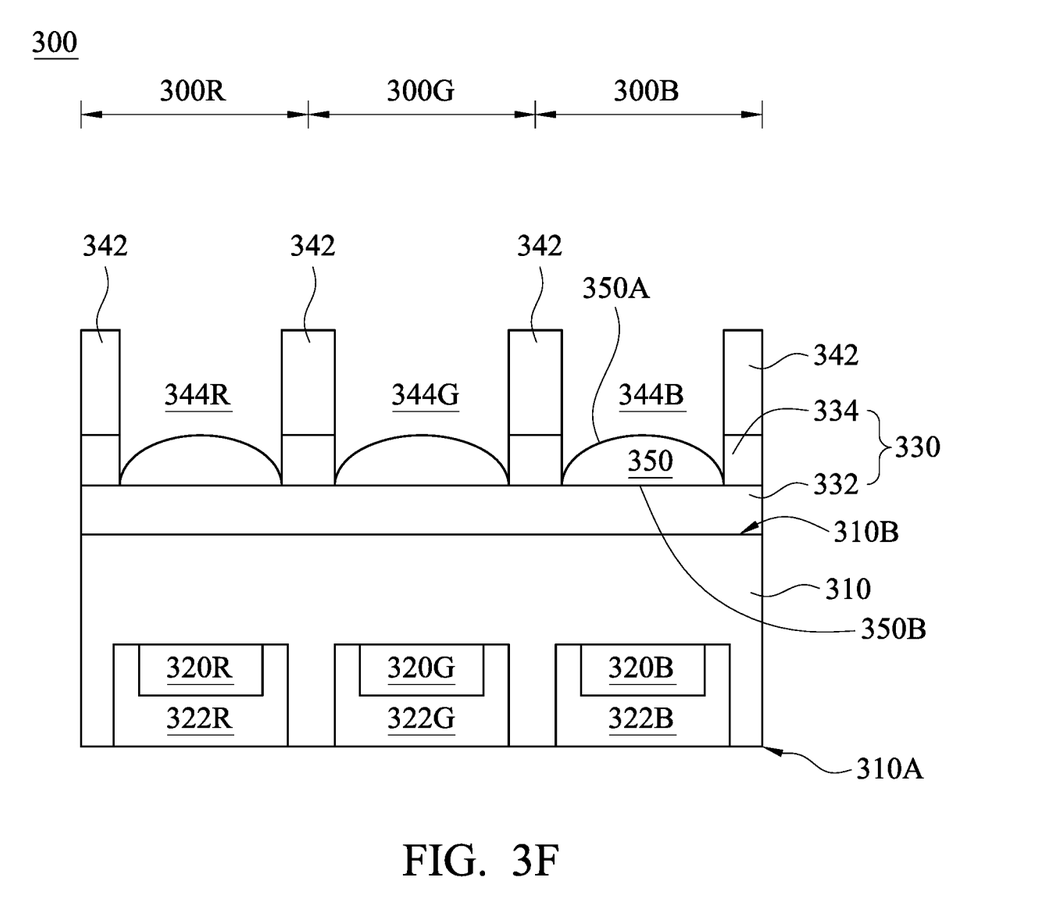

In FIG. 3F, convex dielectric lenses 350 are formed in the recesses 344R/344G/344B and directly on the first dielectric layer 332. The convex dielectric lenses 350 are formed by a deposition process such as CVD, PVD, or the like. In each of the pixel regions 300R/300G/300B, the convex dielectric lens 350 is formed to have a convex side 350A oriented opposite to one of the photo sensitive elements 320R/320G/320B and a planar side 350B oriented toward one of the photo sensitive elements 320R/320G/320B. The material of the convex dielectric lenses 350 is selected to have a refractive index smaller than that of the first dielectric layer 332. In some embodiments, the refractive index of each of the convex dielectric lenses 350 is smaller than the second dielectric layer 334.

In the pixel regions 300R/300G/300B, the width and height of the convex dielectric lenses 350, the thickness of the second dielectric layer 334 and the width of the recesses 344R/344G/344G (i.e. the distance between two opposite sides of the grid 342) are adjustable in accordance with various embodiments. In some embodiments, the width of each of the convex dielectric lenses 350 is substantially equal to or greater than the width of each of the recesses 344R/344G/344G. In some embodiments, the height of each of the convex dielectric lenses 350 is substantially equal to or greater than the thickness of the second dielectric layer 334.

Figure 3G:
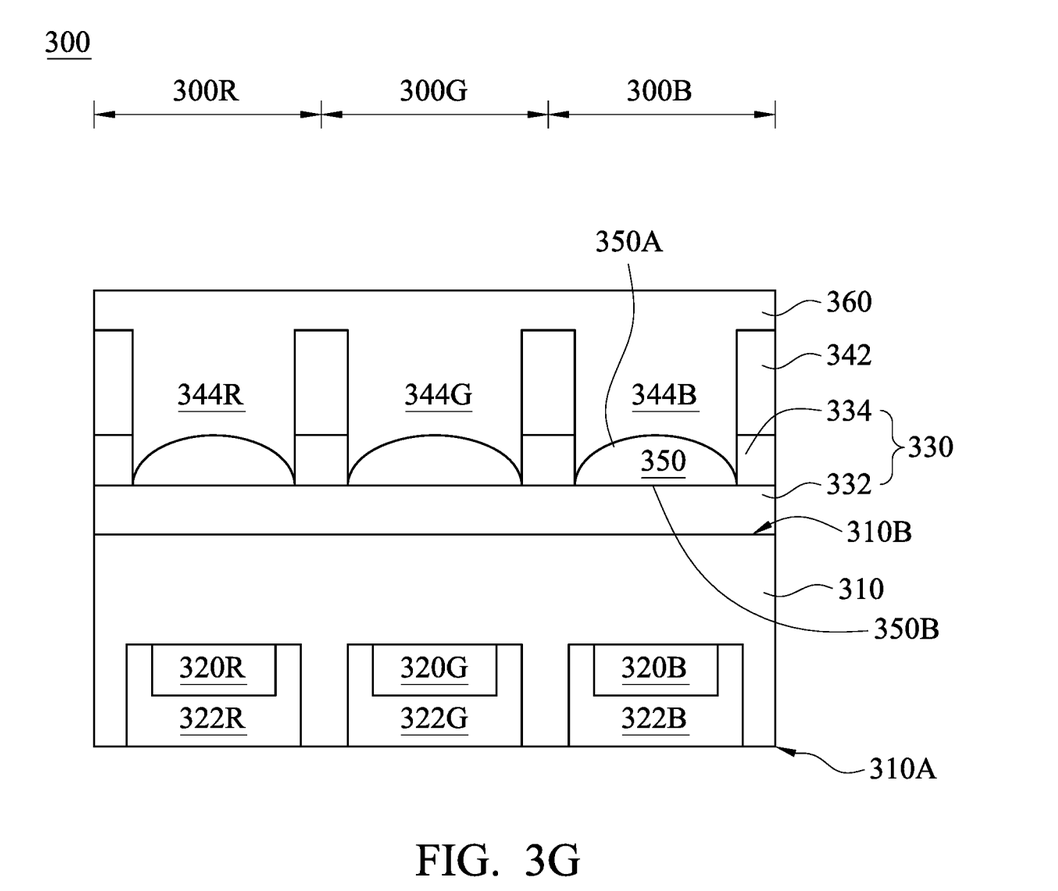

In FIG. 3G, a second dielectric structure 360 is formed on the first dielectric structure 330, the convex dielectric lenses 350 and the grid 342. The second dielectric structure 360 is formed to fill in the recesses 344R/344G/344B. For illustration, the second dielectric structure 360 is formed by a deposition process such as CVD, PVD, ALD, combinations thereof, or the like. The material of the second dielectric structure 360 is selected to have a refractive index smaller than that of each of the convex dielectric lenses 350. In some embodiments, the second dielectric structure 360 at least partially covers the convex dielectric lenses 350.

Figure 3H:
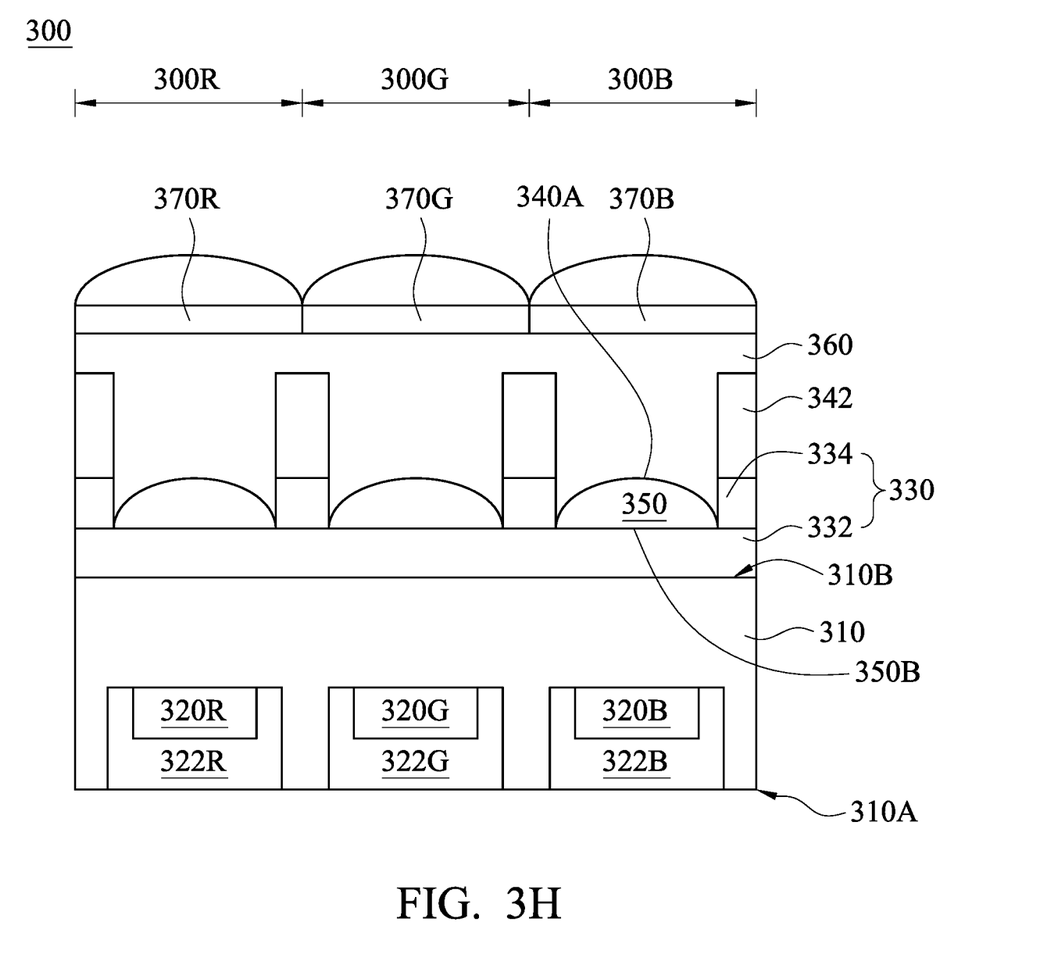

In FIG. 3H, color filters 370R/370G/370B are formed on the second dielectric structure 360. For illustration, the color filters 370R/370G/370B are selectively patterned and sequentially formed by an exposure and development process using a photo-mask.

Further, in FIG. 3H, micro-lenses 380 are respectively formed on the color filters 370R/370G/370B. For illustration, the micro-lenses 380 are formed using a material in a liquid state by a spin-on technique. Such method is performed to produce a substantially planar surface and micro-lenses 380 with a substantially uniform thickness. In some embodiments, other methods, such as CVD, PVD, and/or the like, are also performed for forming the micro-lenses 380.

Figure 4:
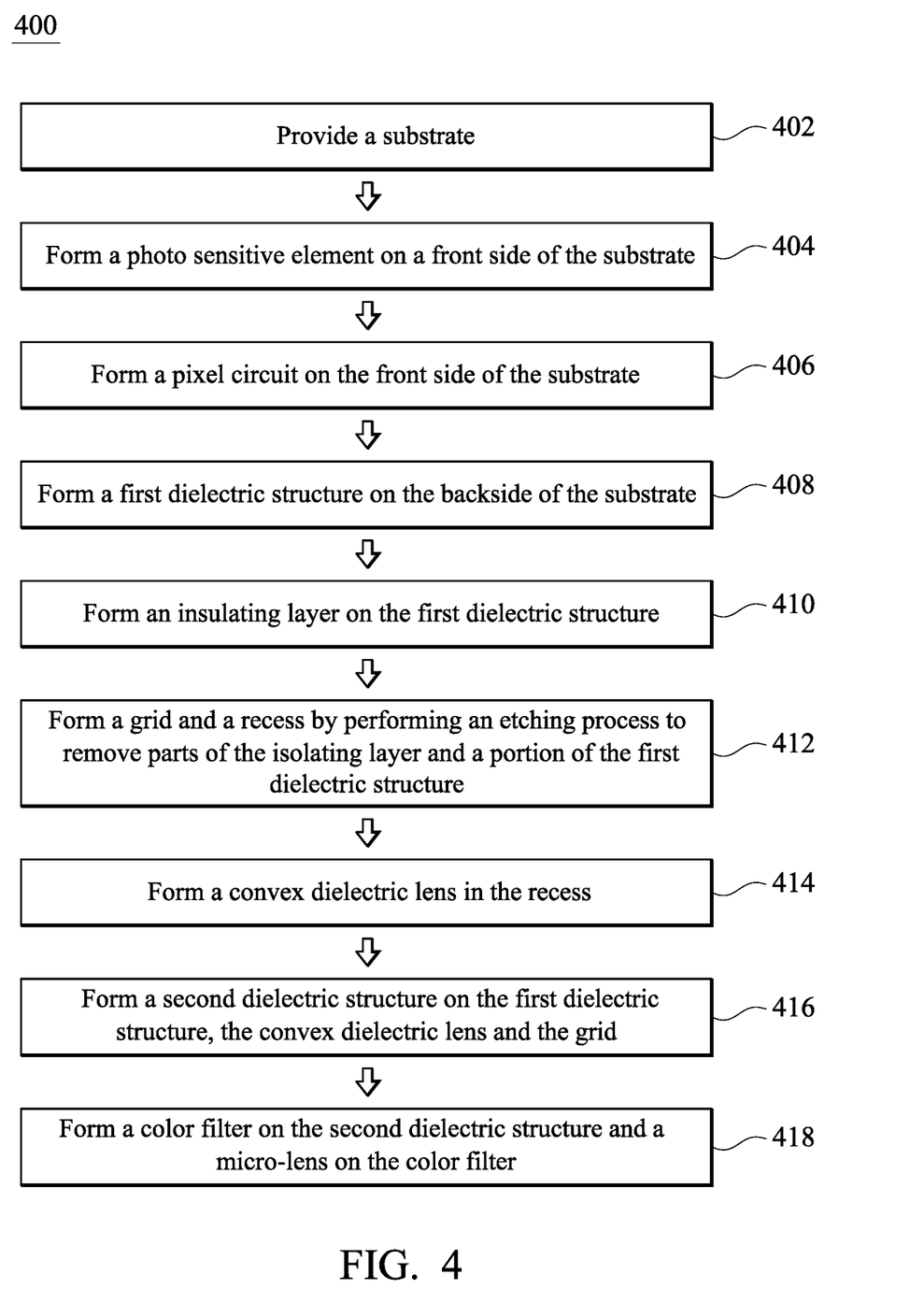
FIG. 4 illustrates a flow chart of a method for fabricating an image sensor device in accordance with some embodiments of the present disclosure.

Referring to FIG. 4 with FIGS. 3A-3H, FIG. 4 is a flow chart of a method 400 for fabricating an image sensor device in accordance with some embodiments. The method 400 begins at operation 402, where a substrate 310 is provided, as shown in FIG. 3A. At operation 404, a photo sensitive element 320R/320G/320B is formed on a front side 310A of the substrate 310 for receiving incident light transmitted through the substrate 310. At operation 406, a pixel circuit 322R/322G/322B is formed on the front side 310A of the substrate 310 for electrical interconnection with the photo sensitive element 320R/320G/320B. At operation 408, a first dielectric structure 330 is formed on the back side 310B of the substrate 310. In some embodiments, the first dielectric structure 330 includes a first dielectric layer 332 formed on the back side 310B and a second dielectric layer 334 formed on the first dielectric layer 332, as shown in FIGS. 3B-3C. At operation 410, an insulating layer 340 is formed on the first dielectric structure 330, as shown in FIG. 3D. At operation 412, a grid 342 and a recess 344R/344G/344B are formed by performing an etching process to remove parts of the isolating layer 340 and a portion of the first dielectric structure 330, as shown in FIG. 3E. At operation 414, a convex dielectric lens 350 is formed in the recess 344R/344G/344B, as shown in FIG. 3F. At operation 416, a second dielectric structure 360 is formed on the first dielectric structure 330, the convex dielectric lens 350 and the grid 344, as shown in FIG. 3G. At operation 418, a color filter 370R/370G/370B is formed on the second dielectric structure 360, and a micro-lens 380 is formed on the color filter 370R/370G/370B, as shown in FIG. 3H.

In accordance with the embodiments of the present disclosure, an additional convex dielectric lens is formed between a color filter and a substrate in each pixel region of an image sensor device, and the convex dielectric lens has a refractive index greater than that of a dielectric structure on a convex side of the convex dielectric lens. Thus, incident light is condensed into a photo sensitive element in a more effective manner, such that the quantum efficiency of the image sensor device is improved. In addition, since the crosstalk issue is avoided, the SNR of the image sensor device increases.

It is noted that, the aforementioned convex dielectric lenses in the present disclosure may be replaced with concave dielectric lenses in accordance with various embodiments. For example, a concave dielectric lens may be formed in replace of the aforementioned convex dielectric lens in each pixel region to have a planar side oriented toward incident light and a concave side oriented toward the photo sensitive element, and the concave dielectric lens has a refractive index greater than that of the aforementioned second dielectric structure and smaller than that of the aforementioned first dielectric layer. Further, in some embodiments, the first dielectric structure is a single layer structure, and the convex dielectric lenses directly adjoin the back side of the substrate.

In accordance with some embodiments, an image sensor device includes a substrate, a pixel circuit, a dielectric structure, a photo sensitive element, a grid, and a convex dielectric lens. The substrate has a first side and a second side opposite to the first side. The pixel circuit is disposed on the first side of the substrate. The dielectric structure is disposed on the second side of the substrate. The photo sensitive element is disposed between the pixel circuit and the dielectric structure. The grid is disposed on the dielectric structure. The convex dielectric lens is disposed on the dielectric structure. The convex dielectric lens has a convex side. A topmost of the convex side is above an interface between the dielectric structure and the grid.

In accordance with some embodiments, an image sensor device includes a substrate, a photo sensitive element, a first dielectric layer, a second dielectric layer, and a convex dielectric lens. The substrate has a first side and a second side opposite to the first side. The photo sensitive element is on the first side of the substrate. The first dielectric layer is disposed on the second side of the substrate. The second dielectric layer is disposed on the first dielectric layer. The convex dielectric lens is on the first dielectric layer and has a convex side. A refractive index of the convex dielectric lens is less than a refractive index of the second dielectric layer.

In accordance with some embodiments, a method includes providing a substrate having a first side and a second side opposite to the first side, forming a photo sensitive element on the first side of the substrate, forming a first dielectric structure on the second side of the substrate, etching the first dielectric structure to form a recess defined by a sidewall of the first dielectric structure, forming a convex dielectric lens in the recess that has a convex side, and forming a second dielectric structure on the convex dielectric lens and in contact with the sidewall of the first dielectric structure.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An image sensor device, comprising:
a substrate having a first side and a second side opposite to the first side;
a pixel circuit disposed on the first side of the substrate;
a first dielectric structure disposed on the second side of the substrate, the first dielectric structure comprising a first dielectric layer and a second dielectric layer disposed on the first dielectric layer, wherein the second dielectric layer has a refractive index lower than a refractive index of the first dielectric layer;
a photo sensitive element disposed between the pixel circuit and the first dielectric structure;
a grid disposed on the first dielectric structure; and
a convex dielectric lens disposed on the first dielectric structure, the convex dielectric lens having a convex side touching a bottom of a sidewall of the second dielectric layer and a planar side opposite the convex side, wherein an interface between the first dielectric structure and the grid is in a position lower than a topmost position of the convex side and higher than the planar side.

2. The image sensor device of claim 1, wherein the first dielectric layer is between the photo sensitive element and the convex dielectric lens.

3. The image sensor device of claim 2, wherein a refractive index of the convex dielectric lens is less than a refractive index of the first dielectric layer.

4. The image sensor device of claim 1, further comprising a second dielectric structure above a top surface of the grid.

5. The image sensor device of claim 4, wherein the second dielectric structure is in contact with a sidewall of the first dielectric structure.

6. An image sensor device, comprising:
a substrate having a first side and a second side opposite to the first side;
a photo sensitive element on the first side of the substrate;
a first dielectric layer disposed on the second side of the substrate;
a second dielectric layer disposed on the first dielectric layer; and
a convex dielectric lens on the first dielectric layer and having a convex side, wherein the second dielectric layer laterally surrounds the convex dielectric lens, the convex side of the convex dielectric lens is in contact with the second dielectric layer only at a sidewall of the second dielectric layer, and a refractive index of the convex dielectric lens is less than a refractive index of the second dielectric layer.

7. The image sensor device of claim 6, wherein a bottom of the convex side of the convex dielectric lens is level with an interface between the first dielectric layer and the second dielectric layer.

8. The image sensor device of claim 6, wherein the refractive index of the convex dielectric lens is less than a refractive index of the first dielectric layer.

9. The image sensor device of claim 6, further comprising a second dielectric structure disposed on the convex dielectric lens, wherein the refractive index of the convex dielectric lens is greater than a refractive index of the second dielectric structure.

10. The image sensor device of claim 9, wherein the second dielectric structure is in contact with a sidewall of the second dielectric layer.

11. The image sensor device of claim 6, wherein a refractive index of the first dielectric layer is greater than the refractive index of the second dielectric layer.

12. The image sensor device of claim 6, further comprising a pixel circuit disposed on the first side of the substrate, wherein the photo sensitive element is disposed between the pixel circuit and the first dielectric layer.

13. The image sensor device of claim 6, further comprising first and second grids disposed on opposite sides of the convex dielectric lens, respectively.

14. The image sensor device of claim 13, wherein the first grid is disposed on and in contact with the second dielectric layer.

15. The image sensor device of claim 13, wherein the first grid is disposed on the second dielectric layer, the first grid and the second dielectric layer define an interface therebetween, and a topmost of the convex side is above the interface.

16. The image sensor device of claim 13, wherein the first grid is disposed on the second dielectric layer, the first grid and the second dielectric layer define an interface therebetween, and a topmost of the convex side is substantially coplanar with the interface.

17. An image sensor device, comprising:
a substrate having a first side and a second side opposite to the first side;
a photo sensitive element on the first side of the substrate;
a first dielectric structure on the second side of the substrate, wherein the first dielectric structure comprises a first dielectric layer and a second dielectric layer disposed on the first dielectric layer, and the second dielectric layer has a refractive index lower than a refractive index of the first dielectric layer;
a convex dielectric lens on the first dielectric structure and having a convex side; and
a second dielectric structure on the convex dielectric lens and in contact with a sidewall of the first dielectric structure, wherein an interface between the sidewall of the first dielectric structure and the second dielectric structure extends downwards from a position higher than a bottom surface of the convex dielectric lens to a position level with the bottom surface of the convex dielectric lens.

18. The image sensor device of claim 17, wherein a topmost position of the interface between the sidewall of the first dielectric structure and the second dielectric structure is higher than or level with a topmost position of the convex side of the convex dielectric lens.

19. The image sensor device of claim 17, further comprising a grid over the first dielectric structure, wherein an interface between a sidewall of the grid and the second dielectric structure is aligned with the interface between the sidewall of the first dielectric structure and the second dielectric structure.

20. The image sensor device of claim 17, wherein the second dielectric layer of the first dielectric structure laterally surrounds the convex dielectric lens, and the first dielectric layer of the first dielectric structure is below the convex dielectric lens.

* * * * *